(12) United States Patent
Schlott et al.

(10) Patent No.: US 10,487,392 B2
(45) Date of Patent: Nov. 26, 2019

(54) DOUBLE-LAYER SYSTEM COMPRISING A PARTIALLY ABSORBING LAYER, AND METHOD AND SPUTTER TARGET FOR PRODUCING SAID LAYER

(71) Applicant: Heraeus Deutschland GmbH & Co. KG, Hanau (DE)

(72) Inventors: Martin Schlott, Offenbach (DE); Albert Kastner, Hanau (DE); Markus Schultheis, Flieden (DE); Jens Wagner, Frankfurt (DE)

(73) Assignee: MATERION ADVANCED MATERIALS GERMANY GMBH, Hanau (DE)

( * ) Notice: Subject to any disclaimer, the term of this patent is extended or adjusted under 35 U.S.C. 154(b) by 41 days.

(21) Appl. No.: 15/504,596

(22) PCT Filed: May 18, 2015

(86) PCT No.: PCT/EP2015/060883
§ 371 (c)(1),
(2) Date: Feb. 16, 2017

(87) PCT Pub. No.: WO2016/026590
PCT Pub. Date: Feb. 25, 2016

(65) Prior Publication Data
US 2018/0223418 A1    Aug. 9, 2018

(30) Foreign Application Priority Data
Aug. 20, 2014 (DE) .......... 10 2014 111 935

(51) Int. Cl.
*C23C 14/34* (2006.01)
*C03C 17/36* (2006.01)
(Continued)

(52) U.S. Cl.
CPC .......... *C23C 14/3414* (2013.01); *C03C 17/36* (2013.01); *C03C 17/3605* (2013.01);
(Continued)

(58) Field of Classification Search
CPC ..... C22C 27/04; C23C 14/3414; C23C 14/08; C03C 17/36; C03C 17/3605; C03C 17/3607
See application file for complete search history.

(56) References Cited

U.S. PATENT DOCUMENTS 6,881,679 B2   4/2005 Jo et al.
7,521,366 B2   4/2009 Kwon et al.
(Continued)

FOREIGN PATENT DOCUMENTS

CN   101158028 A   4/2008
DE   102012112742 A1   4/2014
(Continued)

OTHER PUBLICATIONS

Kennedy et al, "Review of Mid- to High- Temperature Solar Slective Absorber Materials," National Renewable Energy Laboratory Technical Report, pp. 1-52 (Jul. 2002).
(Continued)

*Primary Examiner* — Jessee R Roe
(74) *Attorney, Agent, or Firm* — Fay Sharpe LLP

(57) ABSTRACT

A double-layer system includes a metal layer facing away from a viewer and a coating facing the viewer. In order to make the layer system production process as simple as possible and to provide a sputter deposition method that dispenses entirely with the use of reactive gases in the sputtering atmosphere or requires only a small amount thereof, the coating is in the form of an optically partially
(Continued)

Figure 1:
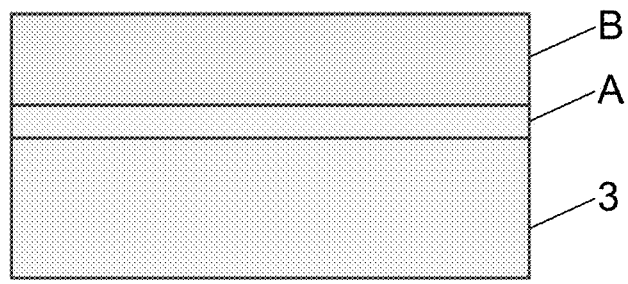

absorbing layer which has an absorption coefficient kappa of less than 0.7 at a wavelength of 550 nm and a thickness ranging from 30 to 55 nm.

11 Claims, 5 Drawing Sheets

(51) Int. Cl.
  *G02B 5/22* (2006.01)
  *C23C 14/02* (2006.01)
  *C23C 14/08* (2006.01)

(52) U.S. Cl.
  CPC ...... *C03C 17/3607* (2013.01); *C03C 17/3649* (2013.01); *C03C 17/3657* (2013.01); *C23C 14/021* (2013.01); *C23C 14/025* (2013.01); *C23C 14/08* (2013.01); *C23C 14/083* (2013.01); *G02B 5/22* (2013.01); *C03C 2217/216* (2013.01); *C03C 2217/218* (2013.01); *C03C 2217/26* (2013.01); *C03C 2218/156* (2013.01)

(56) References Cited

U.S. PATENT DOCUMENTS

| | | |
|---|---|---|
| 7,850,886 B2 | 12/2010 | Walter |
| 8,542,424 B2 | 9/2013 | Abe et al. |
| 2005/0224766 A1 | 10/2005 | Abe |
| 2007/0071985 A1 | 3/2007 | Kumar et al. |
| 2009/0272641 A1 | 11/2009 | Mueller et al. |
| 2011/0081532 A1 | 4/2011 | Lu |
| 2012/0270023 A1 | 10/2012 | Templin et al. |
| 2013/0299753 A1 | 11/2013 | Nakayama |

FOREIGN PATENT DOCUMENTS

| | | |
|---|---|---|
| EP | 2116631 A1 | 11/2009 |
| EP | 2336811 A1 | 6/2011 |
| EP | 2891554 A1 | 7/2015 |
| JP | 2005133105 A | 5/2005 |
| KR | 20140029333 A | 3/2014 |
| WO | 2006078492 A2 | 7/2006 |
| WO | 2011076448 A1 | 6/2011 |
| WO | 2014035196 A1 | 3/2014 |

OTHER PUBLICATIONS

British Standards Institution, "Glass in Building—Determination of Luminous and Solar Characteristics of Glazing," European Standard, EN 410, (1998).
Int'l Search Report dated Jan. 7, 2016 in Int'l Application No. PCT/EP2015/060883.
Written Opinion dated Jan. 7, 2016 in Int'l Application No. PCT/EP2015/060883.
Office Action dated Aug. 1, 2014 in TW Application No. 201430158.

DOUBLE-LAYER SYSTEM COMPRISING A PARTIALLY ABSORBING LAYER, AND METHOD AND SPUTTER TARGET FOR PRODUCING SAID LAYER

CROSS-REFERENCE TO RELATED APPLICATION

This application is a Section 371 of International Application No. PCT/EP2015/060883, filed May 18, 2015, which was published in the German language on Feb. 25, 2016, under International Publication No. WO 2016/026590 A1, and the disclosure of which is incorporated herein by reference.

TECHNICAL FIELD OF THE INVENTION

The invention relates to a double-layer system consisting of an optically absorbing metal layer facing away from a viewer and of a top layer facing the viewer.

Furthermore, the invention relates to a method for producing a light-absorbing top layer of the layer system in that by DC or MF sputtering of a sputter target in a sputtering atmosphere containing a noble gas and a reactive gas in the form of oxygen and/or nitrogen, the light-absorbing top layer is deposited in that a sputter target is used that consists of a target material of substoichiometric oxide or a substoichiometric oxynitride with a first degree of oxygen deficiency, and that the top layer consists of a layer material of substoichiometric oxide or a substoichiometric oxynitride with a second degree of oxygen deficiency which differs from the first degree of oxygen deficiency by not more than +/−25%.

Moreover, the invention relates to a sputter target for use in this method.

PRIOR ART

Light-absorbing layer systems are used for different applications, for instance as solar absorber layers for solar thermal applications or so-called "black matrix" layers in combination with liquid crystal displays.

Light-absorbing layer systems are for instance produced by depositing successive layers by way of cathode sputtering. Atoms or compounds are here ejected out of a solid, the sputter target, by bombardment with energy-rich ions (normally noble gas ions) and pass into the gas phase. The atoms or molecules in the gas phase are finally deposited by condensation on a substrate positioned near the sputter target and form a layer at said place. In the case of "direct current sputtering" or "DC sputtering" a DC voltage is applied between the target used as a cathode, and an anode (often the system housing). By impact ionization of inert gas atoms a low-pressure plasma is formed in the evacuated gas compartment, the positively charged constituents of said plasma being accelerated by the applied DC voltage as a permanent particle stream towards the target, thereby ejecting particles from the target upon impact, which particles, in turn, move towards the substrate and are deposited there as a layer.

DC sputtering requires an electrically conductive target material because, otherwise, the target would become charged due to the permanent stream of electrically charged particles and the direct current field would thus be compensated. On the other hand, this very sputtering method is suited to provide layers of a particularly high quality in an economic manner, so that its use is desired. This is also true for the technologically related MF sputtering in which two sputter targets are alternatingly used in the kHz rhythm as cathode and anode.

DE 10 2012 112 742 A1 describes a generic, highly absorbing layer system and a method for the production thereof. The layer system consists of at least two layers of which one is an anti-reflective layer facing a viewer, which consists of a dielectric material, and of which at least one further layer is an absorber layer facing away from the viewer. An absorption that is as high as possible is basically recommended for the absorber layer, characterized by an absorption coefficient κ (kappa) of at least 0.7 (at a wavelength of 550 nm). A defined upper limit for kappa is not indicated, it is just mentioned that at very high kappa values above 2.5 an effective antireflective treatment of the absorber layer gets more and more difficult. The thickness of the absorber layer is typically in the range of 140-250 nm.

For the preparation of the layer system a sputter target is used that consists of an oxide material with oxygen deficiency that is adjusted either by way of a reduced oxide phase of substoichiometric oxide or oxynitride on the basis of $Nb_2O_{5-x}$, $TiO_{2-x}$, $MoO_{3-x}$, $WO_{3-x}$, $V_2O_{5-x}$ (x>0) or the mixtures thereof alone, or by way of the reduced oxide phase together with a metallic admixture. The absorber layer consists of an oxide or of an oxynitride with substoichiometric oxygen content and is obtained by using said sputter target by way of DC or MF sputtering in a sputtering atmosphere containing a noble gas and a reactive gas in the form of oxygen and/or nitrogen with an amount of not more than 10 vol. %. The amount of oxygen and nitrogen in the material of the sputter target does not differ or differs by not more than +−20% from the amount of oxygen and nitrogen in the oxide or oxynitride of the absorber layer.

Known from EP 2 336 811 A1 is a layer sequence consisting of an aluminum substrate, an intermediate layer of $Al_2O_3$ and a light-absorbing layer system. The layer system consists of a lower layer of a Ti—Al mixed oxide or nitride or oxynitride with the general sum formula: TiAlqOxNy), which may contain substoichiometric contents of oxygen and nitrogen and which forms the real absorber layer, and of an upper layer of stoichiometric or substoichiometric $SiO_2$.

In the solar absorber layers, the layer structure typically comprises a cermet layer and a metallic finishing layer positioned thereunder, which serves as a selective reflector. In the cermet layer, metallic or other electrically conductive particles are embedded in a ceramic matrix, said particles typically having a diameter in the range of 5-30 nm. These layer stacks show a high absorption degree in the solar spectral range (around 350 to 1500 m), whereas their absorption degree in the infrared spectral range is low. For the industrial manufacture of these layer systems electroplating techniques and PVD methods are common. Examples of such layer stacks are Ni/NiO+Al and $TiNx/TiO_2$+Cu. An up-to-date overview is given by "Kennedy, C.E.;—Review of Mid- to High-Temperature Solar Selective Absorber Materials; NREL Technical Report (July 2002)".

Known from EP 2 116 631 A1 is a sputter target for producing a ZnO:Me2 layer or a TiO:Me2 layer. To accelerate and stabilize the sputtering process, use is made of a sputter target that has a matrix of substoichiometric zinc or titanium oxide in which a second metal Me2 is additionally embedded, wherein Me2 stands for Al or niobium.

US 2007/0071985 A1 describes a great number of material compositions, particularly for a sputter target. The compositions contain inter alia other mixed oxides based on ZnO (also with indium oxide, tin oxide, aluminum oxide and gallium oxide) and molybdenum(IV)oxide (MoO2). The amount of $MoO_2$ is said to be between 0.1 and 60 mole %. The densities of the target material vary between about 77% and 95% of the theoretical density. Molybdenum oxide in the form of $MoO_2$ is a stoichiometric oxide of the molybdenum—though not the oxide with the highest possible oxygen content $MoO_3$. It is admixed to the base oxide for improving conductivity, which however de facto—for instance in the mixed oxide system $ZnO:MoO_2$—only achieves good values for small amounts of about 5-10 mole % $MoO_2$.

The target is produced by hot pressing in graphite molds under vacuum or by sintering in air.

The layer deposition by using the target is carried out with a small addition of oxygen in the deposition gas. The oxygen pressure is set independently of the $MoO_2$-content of the target material to 10 mTorr (ca. 1.7 Pa) and is enough to compensate for the oxygen loss normally observed during layer deposition.

The layers made from the target are electrically conductive and show a transmission of at least 80%. They represent alternatives to otherwise common transparent and conductive layers, for instance ITO layers.

CN 101158028 A describes a sputtering method for producing a layer which is called "ZMO transparent conductive film". The target material consists of zinc in which Mo metal pieces are inserted (zinc-molybdenum metal inserted target). The molybdenum proportion is indicated to be 0.5 to 12.5% based on the zinc mass.

This target also serves to produce a transparent and conductive film. Said film is produced by reactive DC magnetron sputtering in a sputtering atmosphere containing argon and oxygen. The oxygen content is in the range of 4-10%.

Dry or wet etching processes are required in the production of the layer systems and for their implementation in complementary layer structures. In the coating industry common etching solutions based on HCl, $HNO_3$, $H_3PO_4$, $H_2SO_4$, $CH_3COOH$, $H_2O_2$, $K_2SO_3$, $K_2SO_4$, $K_2S_2O_5$, $K_2HSO_5$, $KHSO_4$ and optionally also chlorine- or fluorine-containing salts or compounds such as $FeCl_2$, $NH_4F$, $H_5F_2N$, $NaHF_2$, $KHF_2$ are for instance known from U.S. Pat. No. 6,881,679 B2, U.S. Pat. No. 7,850,886 B2 and U.S. Pat. No. 7,521,366 B2.

Cermet layer systems, however, are normally difficult to etch because portions of metallic phase require other etchants than the oxidic matrix. Plasma etching has also turned out to be difficult. For instance in the case of combinations consisting of an oxide and a noble metal, the oxide is predominantly etched so that metal particles remain and may contaminate the sputter system and subsequent substrates.

The wet chemical etching of oxidic constituents often requires hydrofluoric acid which is harmful to health and can only be handled by taking great efforts.

Moreover, the Cr-based "black matrix layers" which are above all used up to substrate generation 5 have the drawback that toxic Cr—VI compounds may be created during wet chemical etching.

TECHNICAL OBJECT

For the above-discussed reasons layer structures are desired that show high absorption and low reflection in the visible spectral range and can be etched without the creation of toxic substances and without particle residues by using simple diluted acids. Metallic layers or layer sheets do not meet this requirement for the above-mentioned reasons.

On the other hand, the layers should be producible preferably by way of DC or MF sputtering for reasons of quality and economy, which presupposes an electrically conductive target material.

It is therefore an object of the invention to develop a layer system which makes it possible to blacken a metallic layer, for instance strip conductors, electrodes, or the like, which may e.g. consist of Al, Ag, Cu, Mo, W, Ni, Ti and alloys thereof, with the help of a single thin layer in such a way that objectionable metallic reflections do not occur any more.

It is a further object to develop a sputter target as well as a deposition method for such black coatings on metal layers. The sputter target should preferably be usable in a DC sputtering process, for which purpose a certain electrical conductivity is of help.

The deposition of the layer should be easily possible so that a sputter deposition method should be indicated that is feasible without or with only a small addition of reactive gases in the sputtering atmosphere.

GENERAL DESCRIPTION OF THE INVENTION

The Light-Absorbing Layer System According to the Invention

As for the layer system, this object starting from a layer system of the above-mentioned type is achieved according to the invention in that the top layer is configured as an optically partially absorbing layer which at a wavelength of 550 nm has an absorption coefficient kappa of less than 0.7 and a thickness in the range of 30 to 55 nm.

It is the aim of the invention to blacken with only one single top layer a metal layer located behind said top layer for a viewer. However, it has been found that it is disadvantageous to start from layer systems in which the top layers have a very high degree of absorption, such as for instance absorber layers with an absorption coefficient $\kappa$ (kappa) of at least 0.70 (at the wavelength 550 nm), as is recommended in the generic prior art. Instead of this, it has surprisingly been found that the top layer shows particularly good blackening properties whenever it is only partially absorbing and the absorption coefficient $\kappa$ (kappa) is below 0.7 and preferably in the range of 0.4 to 0.69.

The fact that the thickness of the top layer is small contributes to the partially absorbing effect. The layer thickness is in the range of 30 to 55 nm. This results in an extinguishing interference for light in the visible wavelength range which is again reflected back to the viewer on the boundary to the metal layer. The combinatory effect of a lower reflection on the front side of the top layer and of the partial extinction by interference with the portion of the light scattered back on the boundary to the metal surface yields a surprisingly lower effective visual reflection $R_{v,eff}$ for the visible wavelength range for the viewer.

A measure of the effectiveness of the cover is thus the altogether low visual reflection $R_v$.

Visual reflection $R_v$ is here understood to be the reflection standardized to eye sensitivity, which is calculated from the total reflection of the layer system. To the extent that the reflection measurement is here carried out through a transparent medium, such as for instance a glass substrate or air, the reflection on the surface of this transparent medium is deducted from the total reflection (in the case of glass this is typically 4%) for determining the effective reflection $R_{v,eff}$ of the double layer system.

Thus, the visual reflection depends on the refractive index of the transparent medium which is in contact with the partially absorbing layer and through which the viewer views the partially absorbing layer. The transparent contact medium may be a dielectric solid, such as glass, or transparent ceramic which serves as a base/substrate for the partially absorbing layer. The transparent medium, however, may also be a gas or a liquid in contact with the partially absorbing layer.

In the case of a contact medium in the form of a dielectric solid, the refractive index is typically in the range of 1.4 to 2.0, so that the visual reflection in these cases is preferably less than 5% and particularly preferably less than 2%.

In the case of a liquid contact medium the refractive index is typically in the range of 0.7 to 1.4, so that the visual reflection in these cases is preferably less than 7% and particularly preferably less than 4%.

For the calculation of the visual reflection $R_v$ the measurement values of a spectrometer are folded with the standardized factors of eye sensitivity and integrated or summed, respectively. These eye sensitivity factors are defined in DIN EN 410.

For the calculation of the effective visual reflection $R_{v,eff}$, i.e. the visual reflection without the influence of the front side of a possibly existing transparent medium, the visual reflection on the front side of this medium is deducted from the total reflection. In the case of a glass substrate, this is thus 4%.

For the absorption index kappa (κ):

$n*kappa=k$, with k=extinction coefficient which, in turn, is included in the complex refractive index $N=n+i*k$ and with the help of which a dampening contribution by the imaginary part is taken into account in the refractive index of the layer.

Moreover, the top layer advantageously has a relatively low refractive index in the range of 2.6 to 2.95 (measured at 550 nm). As a consequence, the reflection on the boundary between the partially absorbing layer and a transparent medium possibly located between the viewer and the partially absorbing layer (typical refractive index 1.0 to 2.0, as already explained above) is lower than for layers with a large kappa. The above data on the refractive index refer to a measurement wavelength of 550 nm.

Moreover, a color of the top layer that is as neutral as possible is aimed at. The color can be described by a color system which is known as "CIE L*a*b". The light color is here described by means of the coordinates a*, b*. As for the coordinates a*, b* of the reflected light portion, $-2<a*<6$; $-9<b*<5$ is preferred.

In comparison with top layers having a high absorption coefficient, top layers with kappa values of less than 0.7 are only optionally partially absorbing. The partial absorption is preferably achieved by way of a comparatively low metal content and a combination of metals with different oxygen affinity.

It has turned out to be advantageous when the partially absorbing layer consists of an oxide or oxynitride layer material with substoichiometric oxygen content and optional metal amount that contains a first metal Me1 and a second metal Me2, wherein the first metal Me1 has a higher oxygen affinity than the second metal Me2, wherein the layer material contains the second metal Me2 in metallic phase, as substoichiometric oxide and/or as substoichiometric oxynitride, and the second metal Me2 is selected from a group 2 consisting of Mo, W or mixtures and alloys of said substances.

For the second metal Me2 with less oxygen affinity, and apart from the pure metals W and Mo and mixtures/alloys of said metals with one another, alloys based on Mo and/or W may also be used that contain additions in the form of elements of the CAS groups IVb, Vb and VIb (Ti, V, Cr, Zr, Nb, Hf, Ta). These show optical properties that resemble those of the pure metals W and Mo and the mixtures of said pure metals, respectively.

The layer material contains the first metal Me1 in oxide or oxynitride phase, wherein preferably Zn, Sn, In, Al, Nb, Hf, Ta, Ti, V, Y, Zr or mixtures and alloys are considered as Me1. Preferably, the first metal Me1 is selected from a group 1 consisting of zinc, tin, indium or mixtures of said substances. Zinc is here particularly preferred.

The first metal Me1 of higher oxygen affinity is thus predominantly present in bound form as oxide or oxynitride (hereinafter also called "base component K1"), whereas the second metal Me2 is present as a substoichiometric oxide (with oxygen vacancies) or substoichiometric oxynitride (with oxygen or nitrogen vacancies) or in metallic form. This yields an electron configuration with free valences that produce the desired light absorption and thereby contribute to the partially absorbing character of the top layer. This component is hereinafter also called component K2 or "blackening component". An electron configuration with free valences is not given if component K2 is present in an oxidation state determined by stoichiometry, for instance as $MoO_2$ or as $WO_2$, even if this is not its respective, maximally possible oxidation degree. The reduction degree can be described as a chemical formula with: $K2-O_{2-w}$ with: $0<w<2$).

Hence, on the whole, there is no fully oxidic layer material, but an oxide or oxynitride layer material with substoichiometric oxygen content. The substoichiometric oxygen content corresponds arithmetically to a metal content, for instance of the second metal Me2 (in an otherwise fully oxidic matrix). In this connection it is advantageous that if the substoichiometrically existing oxygen on the whole is arithmetically ascribed to a fully oxidic phase, a proportion in the range of 10 to 20 vol. % in the layer material is obtained for the second metal Me2 in metallic phase.

Hence, it is assumed in purely arithmetical terms that possibly existing substoichiometric oxides are distributed over the most stable form of the fully stoichiometric oxides plus metal. The partially absorbing layer thereby contains a substoichiometric oxide or a substoichiometric oxynitride which has unoccupied O or N valences. In the case of the blackening component of substoichiometric oxynitride a small part (preferably not more than 15%) of the oxygen sites is replaced by nitrogen.

The layer material consisting of the component K2 and the base component K1 is also designated hereinafter on the whole as "base material". The quantity proportion of the blackening component K2 (e.g. the molybdenum amount) follows from the volume proportion of substoichiometric oxide/oxynitride or metal of Me2 within the matrix.

The etch rate of the base material depends on the composition. Substoichiometric or metallic phases of the component K2 do not tend to form structures that are difficult to etch. The etch rate is therefore primarily determined by the amount of the base component K1. Zinc oxide, tin oxide and indium oxide, however, are relatively easily etchable oxides with a comparatively high specific etch rate.

For high etchability the content of oxides that are difficult to etch must be set to be rather low. Within the group of the metals with oxygen affinity, these are above all oxides of the group of aluminum oxide, niobium oxide, hafnium oxide, tantalum oxide, titanium oxide, vanadium oxide, yttrium oxide and zirconium oxide. As a rule, the practical limit for high etchability is about 50 vol. %, depending on the etchant.

Moreover, the partially absorbing layer preferably has an X-ray amorphous homogeneous structure. This means that it contains no crystalline structures that are detectable by way of X-ray diffractometer measurements. This yields a homogeneous etching behavior, so that during etching no particles are formed, as for instance in the case of etching with $H_2O_2$, acids or fluoride ions. Even under the transmission electron microscope, the layers characterized thereby show no structures down to the resolution limit of 2 nm. Thermodynamically, the amorphous structure is however unstable, so that nano- or microcrystalline deposits may form due to annealing or heating up.

The etch rate of the base material can be reduced by a partial replacement of the oxygen by nitrogen, but this effect is low and is at best suited for fine adjustment. The etch rate of the base material can substantially only vary within the limits defined by the composition and particularly by the amount of component K1. Specifically, the etch rate of the base material can hardly be slowed down below the specific etch rate predetermined by the component K1 in combination with K2. Therefore, it may be of advantage to modify the etching behavior of the base material at a target etch rate that must be lower than the specific etch rate of the component K1.

To this end the top layer preferably contains a third metal Me3, selected from a group 3 consisting of niobium, hafnium, titanium, tantalum, vanadium, yttrium, zirconium, aluminum or mixtures of said substances, which is present as an oxide, substoichiometric oxide or substoichiometric oxynitride. Niobium and titanium are here particularly preferred.

The metals of group 3 also show a higher oxygen affinity than the metals Me1 of the base component K1. Their oxide or oxynitride compounds within the partially absorbing layer will also be called "additional component K3" in the following. Hence, within the top layer a part of the base component K1 is replaced by the additional component K3. Like the base component K1, the additional component K3 is present as a fully oxidized metal (=full oxide) or as a substoichiometric oxide (with oxygen deficiency) or as a substoichiometric oxynitride (with oxygen deficiency), i.e. preferably as niobium oxide, hafnium oxide, titanium oxide, tantalum oxide, vanadium oxide, yttrium oxide, zirconium oxide and/or aluminum oxide. The etching behavior of the layer material can be adjusted through the type, composition and quantity proportion of the additional component K3 within limits that are clearly wider than without the additional component K3. With the addition the etch rate of the layer material can be slowed down within wide limits and finely adjusted to a preferred range (e.g. of 0.2-10 nm/s). The oxidic additional component K3 is more difficult to etch, i.e. at a slower rate, than the oxidic base component K1. The additional component K3, for instance $Nb_2O_5$, replaces a part of the base component (for instance ZnO). Base component K1 and additional component K3 together make up between 80 and 90 vol. % of the layer material. The substantially oxidic matrix of the layer material is in this case composed of the base component K1 and the additional component K3; the blackening component K2 is distributed therein. The etching behavior of the partially absorbing layer can be adapted via the additional component K3 to the etch rate of the metal layer to be blackened so as to avoid, for instance, an underetching of layers. A suitable etchant is for instance an aqueous solution of $H_2O$=785 ml+$H_2O_2$=215 ml+30 g $K_2S_2O_5$+15 g $H_5F_2N$. Such etchants will be called "etchants 1" in the following.

For systems with a low content of additional component K3, etching with another common etchant, as are e.g. used for Al and Mo layers, is also possible. $CH_3COOH$ 10%+$H_3PO_4$ 71%+$HNO_3$ 1.8%+DI $H_2O$ should here be mentioned by way of example. Such etchants will be called "etchants 2" in the following.

Preferably, the content of oxides, substoichiometric oxides or oxynitrides of the metal Me3 of group 3 is in the range of 0 to 50 vol. %, preferably in the range of 2 to 45 vol. %, and particularly preferably in the range of 5 to 40 vol. %. These amounts are each calculated as stoichiometric oxide. For "etchant 1", the content of said oxides is in the range of 0 to 50 vol. %, preferably in the range of 10 to 45 vol. %, and particularly preferably in the range of 25 to 40 vol. %. To achieve—in the case of metal layers based on aluminum or molybdenum—an etch rate comparable to said layer materials with "etchant 2", the content of said oxides of group Me3 is in the range of 0 to 50 vol. %, preferably in the range of 2 to 30 vol. %, and particularly preferably in the range of 3 to 20 vol. %.

The metal layer is preferably based on a metal selected from the group Al, Ag, Cu, Mo, Ni, Ti or alloys thereof. Hence, one of the said metals accounts for 50 wt. % of the metal layer, or an alloy which contains one of the metals as the main constituent (in volume units) accounts for at least 50 wt. % of the metal layer.

The Sputter Target According to the Invention

The above-mentioned object is achieved according to the invention with respect to the sputter target particularly for the production of the partially absorbing layer of the layer system according to the invention in that it consists of a target material containing a first metal Me1 and a second metal Me2, wherein the first metal Me1 is selected from a group 1 consisting of tin, zinc, indium or mixtures of said substances and in the form of an oxide, oxynitride, substoichiometric oxide or substoichiometric oxynitride, and the second metal Me2 is selected from a group 2, consisting of Mo, W or alloys of said substances, which contain at least 50 wt. % of said metals.

The sputter target according to the invention consists of an oxide or oxynitride and of at least one metal or substoichiometric oxide. Therefore, in comparison with a stoichiometric, fully oxidic material, it has an oxygen deficiency which follows from the metal content and the content of substoichiometric oxides, respectively. In accordance with the layer composition the sputter target also contains metals or oxides of the above-mentioned components K1, K2 and optionally K3, wherein the component K2 is preferably present in metallic form.

In the sputter target according to the invention the oxygen deficiency of the partially absorbing layer according to the invention is substantially already present in that the oxygen deficiency of the sputter target corresponds approximately to the layer to be sputtered or at best slightly exceeds the same. A fine adjustment of the layer stoichiometry can be achieved by small additions of reactive gases (particularly of oxygen) with not more than 5 vol. % in the sputtering atmosphere, so that the said technological difficulties are avoided in the sputtering of metal targets in a highly reactive atmosphere.

Apart from oxygen, the addition of other reactive gases, such as nitrogen, is also suited.

The oxygen deficiency of the sputter target according to the invention follows from the content of metal and possible substoichiometric oxides. According to the invention this metal content is 10 to 20 vol. %, wherein said information is based on the purely arithmetical assumption that the oxygen content of possibly existing substoichiometric oxides is distributed over the most stable oxides up to full stoichiometry, so that in purely arithmetical terms a metallic phase remains with the above-mentioned proportion.

During sputtering of such targets a predetermined oxygen deficiency is thus set in the deposited layer. The proportion of blackening component K2 in the target material is configured such that it accounts for 50% or more of this deficiency.

As for the adaptation of the etching behavior of the partially absorbing layer to be produced, the material contains one or more additional components, selected from a group 3 consisting of oxides, substoichiometric oxides or oxynitrides of niobium, hafnium, titanium, tantalum, vanadium, yttrium, zirconium, aluminum or mixtures thereof.

The metals of group 2 are here preferably contained with an amount between 10 and 20 vol. %.

The content of oxides, substoichiometric oxides or oxynitrides of group 3 is preferably in the range of 0 to 50 vol. %, preferably in the range of 2 to 45 vol. % and particularly preferably in the range of 5 to 40 vol. % (each calculated as oxide). For "etchant 1" the content of oxides is in the range of 0 to 50 vol. %, preferably in the range of 10 to 45 vol. %, and particularly preferably in the range of 25 to 40 vol. %. For "etchant 2" the content of oxides is in the range of 0 to 50 vol. %, preferably in the range of 2 to 30 vol. %, and particularly preferably in the range of 3 to 20 vol. %.

Preferably, the target material has a degree of reduction that is obtained in the oxidic target material arithmetically as the amount of the second metal Me2 in metallic phase in the range of 10 to 20 vol. % if the substoichiometrically existing oxygen on the whole is ascribed to a fully oxidic phase.

The degree of reduction is determined in the simplest case in that at least five samples with a weight of 1 g are taken from different areas of the target and the increase in weight is determined on said samples, which increase is obtained if the target material is pulverized under inert gas (particle size<10 μm) and the powder is annealed in pure oxygen at 1000° C. for 1 hour. The reduction degree R [%] is thus determined from the increase in weight as follows:

$$R\ [\%]=100\ \text{weight increase/total weight of oxygen of the annealed sample.}$$

As an alternative, the reduction degree can be verified in that at least five samples with a weight of 1 g are taken from different thickness areas of the target and the oxygen content is determined on these samples through conversion to $CO_2$ by way of hot carrier gas extraction with a measuring instrument of the company LECO. Knowing about the amounts of metal atoms contained (which can be determined by way of ICP spectroscopy), the degree of reduction can be calculated with respect to a sample consisting of the thermodynamically most stable oxides. The result of the hot gas extraction must approximately conform to oxygen annealing at 1100° C.

This hot carrier gas extraction as an alternative measuring method is however not suited if the heating of the sample leads to the formation of oxides with high vapor pressure. In this case another method is used for verifying the reduction degree, in which the oxygen content of 1 g-samples is determined in a two-stage method. First, the exactly weighed sample amount is converted by way of suitable acids into an aqueous solution. The metal concentrations in the extraction solution are subsequently determined by ICP-OES. The theoretical weight of the fully oxidic sample can then be calculated from the determined metal contents, with the corresponding amount (MOxygen stoichiometric) of stoichiometric oxygen of the respectively most stable oxides (such as e.g. ZnO, $Nb_2O_5$, $TiO_2$, $MoO_3$, $W_2O_3$, $Al_2O_3$, $Ta_2O_5$ etc.) being added to the respective metal weight for this purpose.

The difference (delta M) with respect to the real weight of the sample then represents the oxygen deficiency of the sample, which by analogy to the above can again be converted into a reduction degree R:

$$R[\%]=100\times\text{Delta M/MOxygen stoichiometric}$$

It has turned out to be advantageous when both composition and reduction degree are as constant as possible over the area and thickness of the sputter target. Therefore, the sputter target according to the invention preferably comprises a target material with homogeneous composition of the substances forming the same, in the sense that the composition of five samples of 1 g each has a standard deviation of each of the substances of less than 5%, based on the maximum content of the substance, and a homogeneous reduction degree in the sense that the reduction degree of five samples of 1 g each has a standard deviation in the reduction degree of less than 5%.

With respect to a uniform sputtering of the sputter target, the target material preferably has a density of more than 95% of the theoretical density and a content of impurities of less than 500 wt. ppm. All elements that are not intentionally added as dopants or additions to the target material are here regarded as impurities.

Furthermore, the sputter target according to the invention has a specific resistance of <10 $\mu\Omega$*cm, preferably <1 $\mu\Omega$*cm.

Sputter targets according to the invention can best be produced by the hot pressing or hot isostatic pressing (HIP) of homogeneous mixtures of the corresponding powder components. For the production of large sputter targets via HIP an intermediate step via cold isostatic pressing (CIP) is advantageous to obtain homogeneously dense green bodies of a high form quality. Furthermore, it has been found that the degassing of the powder is important. Degassing should be carried out at 200-500° C., and the compaction under pressure, depending on the respective composition, at 850-1150° C. An advantageous press force during hot pressing is between 200 and 300 bar and in the case of hot isostatic pressing in the range between 1000 and 2000 bar.

The Production Method According to the Invention for the Partially Absorbing Layer With respect to the method for producing the layer system, the above-mentioned object starting from a method of the above-mentioned type is achieved according to the invention in that as the top layer an optically partially absorbing layer is deposited, the layer thickness of which is adjusted to the range of 30 to 55 nm and the absorption coefficient kappa of which at a wavelength of 550 nm is adjusted to less than 0.7.

In the method according to the invention a top layer is produced with a small thickness and a comparatively low absorption coefficient. These properties normally hint at a low optical absorption and thus at a high reflection of the underlying metal layer. Surprisingly, however, this is here not the case. The layer has a partially absorbing effect for light from the visible wavelength range. Therefore, despite its small thickness and the not very high absorption coefficient, it produces a high coverage for underlying layers for a viewer looking thereat. It is therefore suited to blacken, even as a single top layer, a metal layer located therebehind for a viewer, i.e. to strongly reduce reflection. This can be attributed to the fact that the layer thickness in the range of 30 to 55 nm yields an extinguishing interference for light in the visible wavelength range which is reflected back to the viewer on the boundary to the covered layer. The combinatory effect of lower reflection on the front side of the top layer, partial absorption in the layer according to the invention and the partial extinction by interference with the amount of the light scattered back on the boundary to the covered layer leads to a surprisingly lower effective visual reflection $R_{v,eff}$ for the visible wavelength range for the viewer. This has already been discussed above in detail for the layer system according to the invention.

The partially absorbing layer is produced by using a sputter target which consists of a target material of substoichiometric oxide or a substoichiometric oxynitride with a first degree of oxygen deficiency, and in that the partially absorbing layer consists of a layer material of substoichiometric oxide or a substoichiometric oxynitride with a second degree of oxygen deficiency, which differs from the first degree of oxygen deficiency by not more than +/−5%.

Reference value for the percentage information is the higher one of the two oxygen deficiency degrees.

Used is preferably a sputter target according to the invention, as has been described above. The sputter target is sputtered in a pure DC or MF sputtering process for instance in a sputtering atmosphere of argon. An optically partially absorbing layer which has an oxygen deficiency that is very close to the sputter target is thereby produced on a substrate or on a metal layer.

The method is distinguished by the interaction of a sputtering atmosphere of only little reaction on the one hand and by use of a sputter target, on the other hand, which contains the second metal Me2 in the form of a substoichiometric oxide or in a metallic phase. The deposited layer differs in its chemical composition not substantially from the target material used. This allows a stable control of the sputtering process and the reproducible adjustment of the properties of the deposited layer.

A small addition of reactive gas of preferably less than 5 vol. % of the sputter gas stream is at best useful to allow a fine adjustment of the layer properties. Preferably, sputtering is carried out without a reactive gas.

As a result, the target material can be transferred unchanged or with only little oxidation into the substoichiometric oxide of the partially absorbing layer. It must here be borne in mind that a certain loss of oxygen in the sputtering process may make a small contribution to the adjustment of the desired substoichiometry of the partially absorbing layer.

With respect to a reproducible sputtering result and a less complex sputtering process, it has turned out to be useful when use is made of a sputter target that consists of a target, material of substoichiometric oxide or a substoichiometric oxynitride with a first degree of oxygen deficiency, and that the top layer consists of a layer material of substoichiometric oxide or a substoichiometric oxynitride with a second degree of oxygen deficiency that differs from the first degree of oxygen deficiency by not more than +/−5%. In a sputter target with an oxygen deficiency of for instance 15%, the layer material produced therefrom is thus an oxygen deficiency in the range of 10-20%.

Advantageous developments of the method follow from the features of the partially absorbing layer, as indicated in the claims with respect to the layer system according to the invention and already explained above in the explanation of the layer system.

EMBODIMENT

Figure 3:
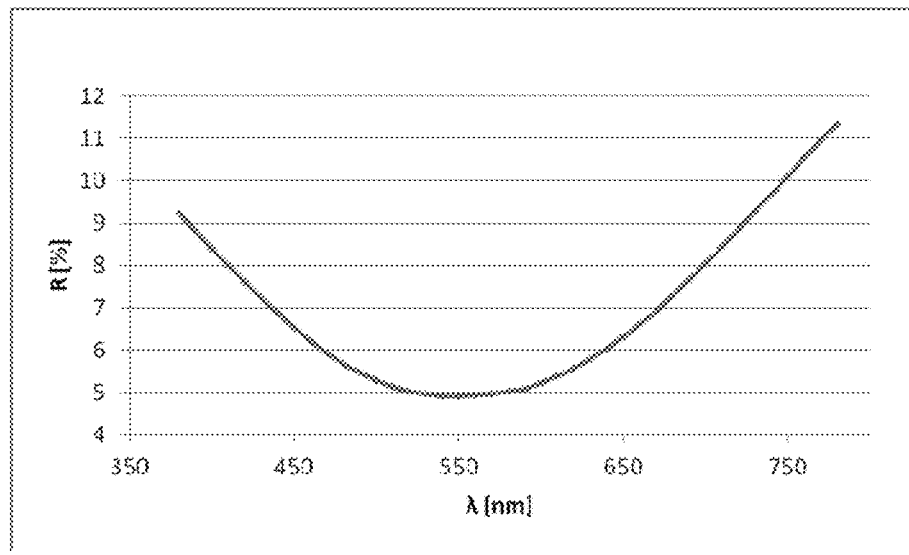
Figure 4:
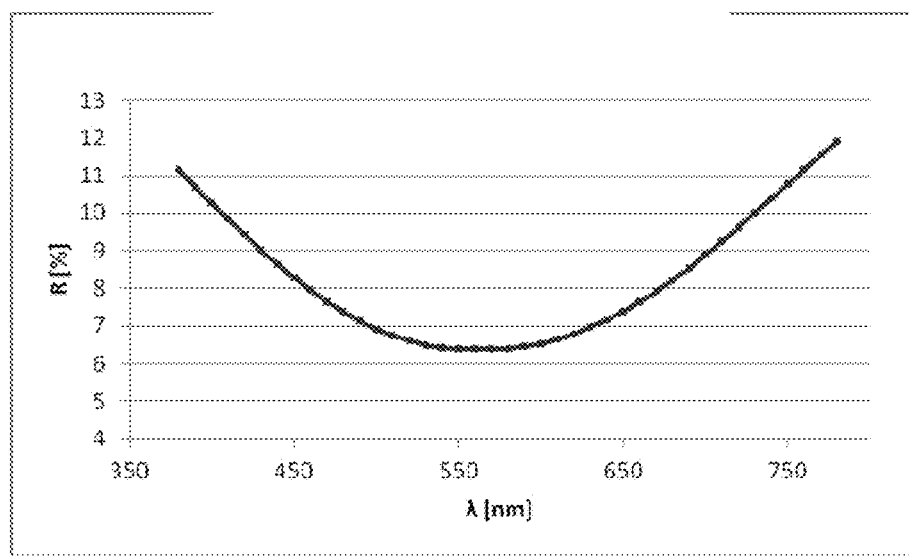
Figure 5:
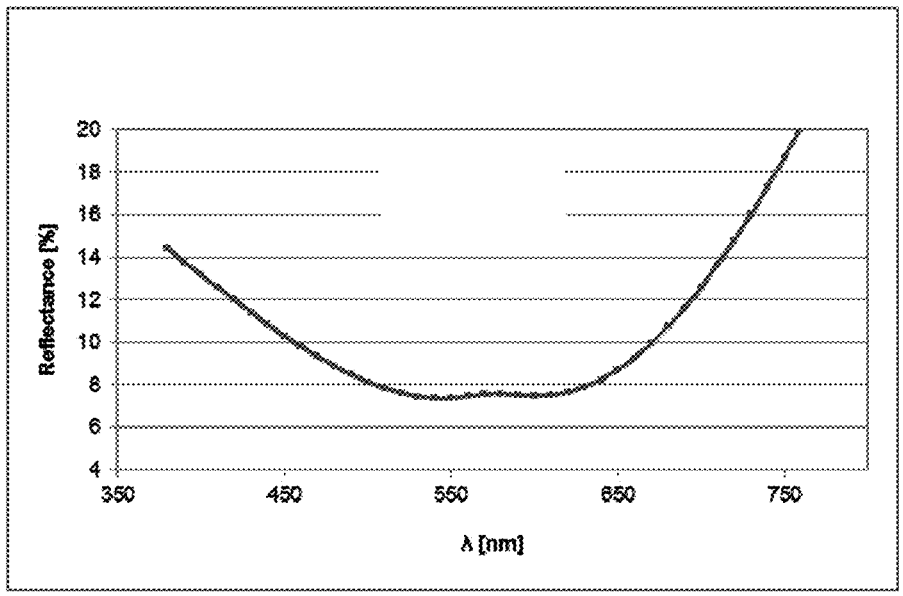
Figure 6:
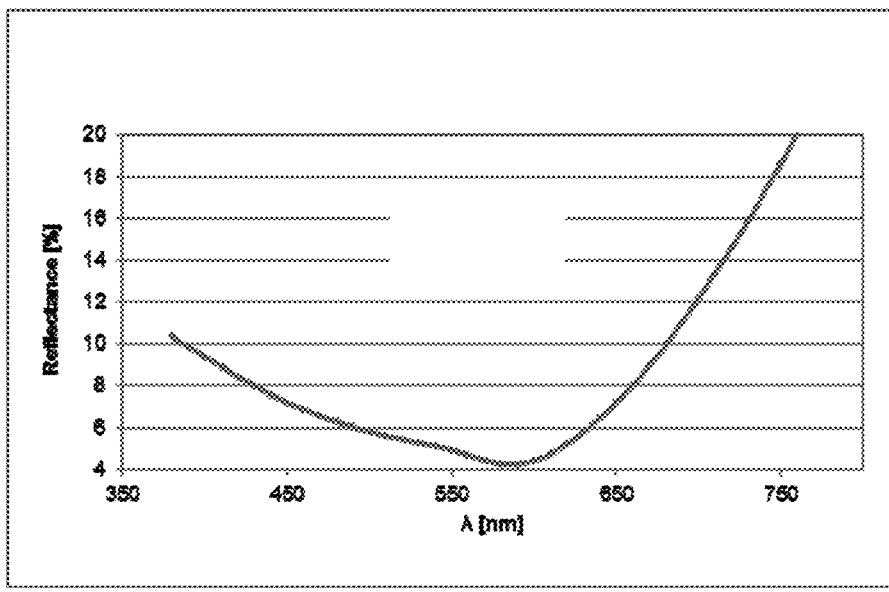
Figure 7:
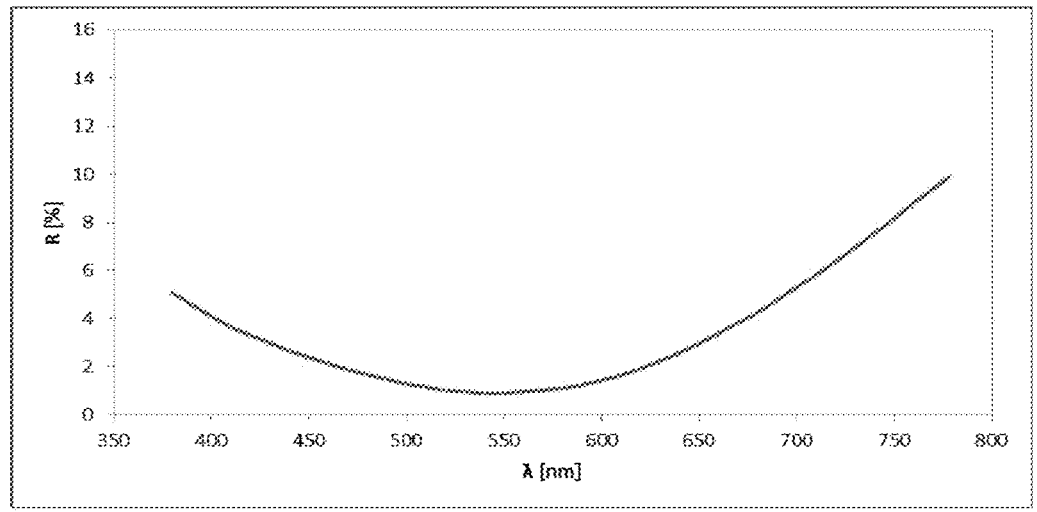
Figure 8:
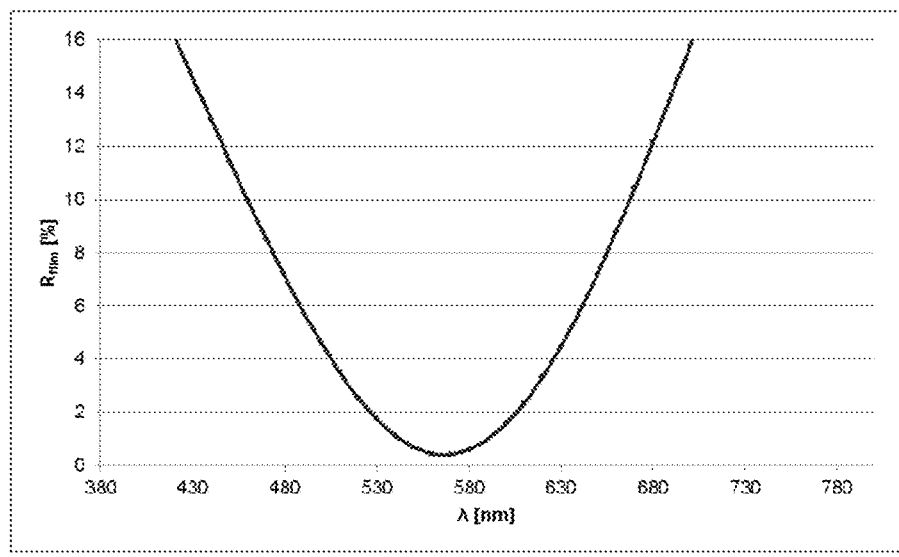
Figure 9:
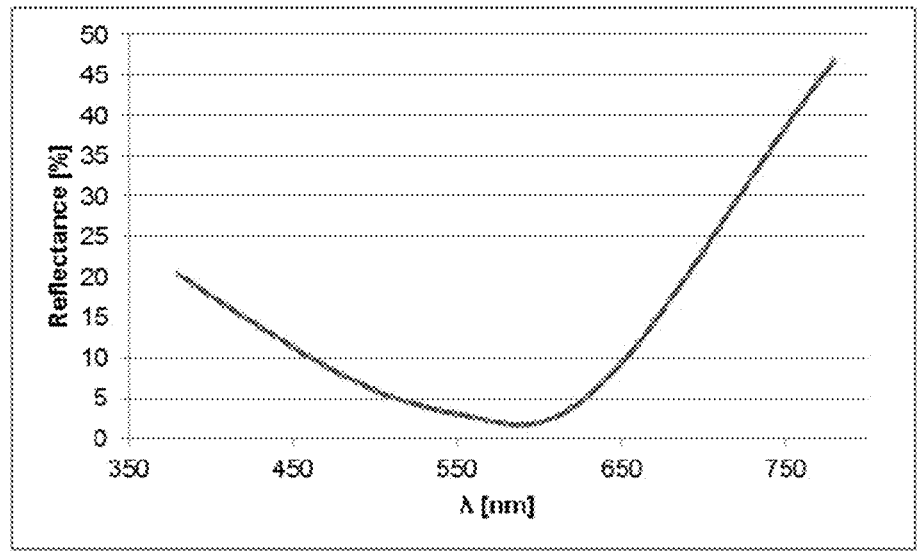
Figure 10:
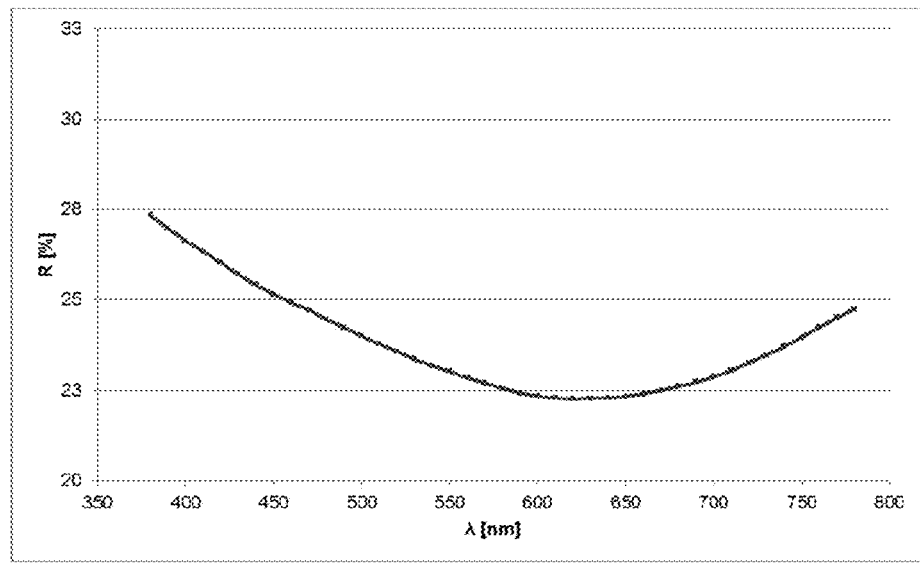

The invention will now be explained in more detail with reference to a patent drawing and an embodiment. In detail, FIG. 1 is a schematic representation of the layer system according to the invention in one embodiment in contact with a substrate of dielectric solid in a cross section, FIG. 2 is an electron micrograph of a partially absorbing layer according to the invention, FIG. 3 shows the spectral curve of the reflection of the layer system glass/S1 (42.5 nm) Mo (40 nm), FIG. 4 shows the spectral curve of the reflection of the layer system glass/S2 (42.5 nm)/Mo (40 nm), FIG. 5 shows the spectral curve of the reflection of the layer system glass/S1 (40 nm)/Cu (100 nm), FIG. 6 shows the spectral curve of the reflection of the layer system glass/S2 (35 nm)/Cu (100 nm), FIG. 7 shows the spectral curve of the reflection of the layer system air/S3 (33 nm) Mo (130 nm), FIG. 8 shows the spectral curve of the reflection of the layer system air/S3 (40 nm)/Al (130 nm), FIG. 9 shows the spectral curve of the reflection of the layer system air/S3 (40 nm)/Cu (250 nm), and FIG. 10 shows the spectral curve of the reflection of the layer system air/S3 (50 nm)/Mo (30 nm).

FIG. 1 schematically shows a layer system 1 consisting of two layers A, B according to the invention. The first layer is a partially absorbing layer A sputtered onto a transparent glass plate 3, which is in contact with a metal layer B. The partially absorbing layer consists of a layer material of a base component K1 of oxide of a first metal Me1 and of a metallic blackening component K2 of metallic phase or a partially oxidized phase of a second metal Me2. Optionally, an additional component K3 is contained that is present as an oxide of a third metal Me3. The layer system is almost opaque for a viewer with viewing direction from the glass plate 3 and almost black at the same time.

A plurality of these double-layer systems with the outlined structure was produced, and the properties thereof were measured. The respective compositions and properties are indicated in Table 1 and Table 2.

Figure 2:
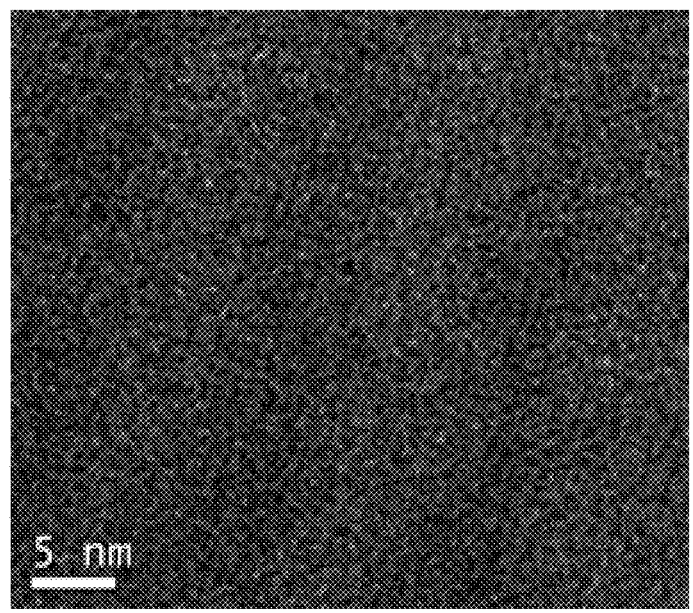

FIG. 2 shows an electron micrograph of a partially absorbing layer according to Example S2 described in more detail below (see Table 1, line 2). No metal deposits can be seen. This result is also confirmed by an X-ray measurement. In a corresponding X-ray diffraction diagram, no concrete diffraction lines are visible; the layer is X-ray amorphous.

Measuring Methods

Layer Thickness Measurement

The layer thickness measurement was carried out with a stylus-type profilometer (Ambios Technology XP-200). For the preparation of the sample a part of the substrate was covered with a Kapton tape. The correspondingly covered area was not sputtered. After removal of the cover the layer thickness was determined on the created step between coated and uncoated area.

Instrument calibration to 10 μm on supplied standard. The measurement was repeated at 10 different places of the sample and the average value was formed.

Absorption Coefficient Kappa

The absorption coefficient is a measure of the weakening of electromagnetic radiation in material and was determined with a spectrometer (Perkin Elmer Lambda900/950). The transmission and reflection measurement values are here integrally determined on the layers in the wavelength range 380-780 nm in 10 nm step size.

The transmission and reflection values obtained were read into the software of the company Woollam M2000 and the refractive indices and absorption coefficients were calculated. As reference, the measuring instrument was calibrated to an uncoated substrate.

Reflection Rv

Reflection $R_{v,eff}$ was measured as directed reflection. Diffusely reflecting light is not taken into account (i.e. no integrating sphere). For the measurement the spectrometer Perkin Elmer Lambda35 was used. Calibration is carried out by way of an Al sample of known reflection, which has been calibrated by the producer.

Visual reflection $R_v$, is here understood to be the reflection standardized to eye sensitivity, which is calculated from the total reflection of the layer system. If the reflection measurement is here carried out through a transparent medium, such as a glass substrate or air, the reflection on the surface of this transparent medium is deducted from the total reflection for determining the effective reflection $R_{v,eff}$. 4% (reflection on the glass surface) were therefore deducted in the table values.

Color Value Measurements

The color of the composition, e.g. after application of the composition in a layer structure, is defined by the color values in the CIE L*a*b* color space according to the international standard EN ISO 11664-4. Color value measurements were carried out with a Konica Minolta Spectrophotometer CM-700d (of Konica Minolta Sensing Europe B.V.) in the CIE L*a*b* color space system. After calibration with supplied black and white reference ("black hole" and a white ceramic plate), the measurements were carried out. The spectrophotometer was here placed on a dry and burned layer. 5 measurements each were carried out, and the arithmetic mean was formed subsequently.

Determination of the Particle Size

The particle size of the powders used was determined by way of laser diffraction and with the instrument CLIAS 990. The sample was dispersed in distilled water and 0.1 Ma % sodium pyrophosphate by ultrasound for 30 s and subsequently measured. The Fraunhofer method was used for evaluation. The d50 value was here determined based on the volume of the particles that marks the particle size at which 50% of the particles are smaller than that value.

Determination of the Reduction Degree

Samples were taken from the targets and an exactly weighted amount was dissolved in suitable acids such as HCl and HF. These solutions were analyzed by way of ICP OES and the content of metals was determined. The theoretical weight of the fully oxidic sample was calculated from the metal contents determined in this way, the corresponding amount (MOxygen stoichiometric) of stoichiometric oxygen of the respectively most stable oxide (such as e.g. ZnO, $Nb_2O_5$, $TiO_2$, $MoO_3$, $W_2O_3$, $Al_2O_3$, $Ta_2O_5$) being added to the respective metal weight for this purpose. The difference (delta M) with respect to the real weight of the sample then represents the oxygen deficiency of the sample that can be converted into a reduction degree R: R[%]=100×delta M/MOxygen stoichiometric.

Emission Spectrometric Analysis (ICP-OES)

An emission spectrometer Varian Vista-MPX and ICP expert software (of the company Varian Inc.) was used. First of all, two calibration samples are respectively produced for the metals from standard solutions with known metal content (e.g. 1000 mg/l) in aqua regia matrix (concentrated hydrochloric acid and concentrated nitric acid in the ratio 3:1). The parameters of the ICP device were:

Power: 1.25 kW
Plasma gas: 15.0 l/min (argon)
Auxiliary gas: 1.50 l/min (argon)
Atomizer gas pressure: 220 kPa (argon)
Repetition: 20 s
Stabilization time: 45 s
Observation height: 10 mm
Sucking of sample: 45 s
Flushing time: 10 s
Pump rate: 20 rpm
Repetitions: 3

For the measurement of a sample: 0.10+/−0.02 g of the sample is mixed with 3 ml nitric acid and 9 ml hydrochloric acid, as indicated above, and solubilized in a microwave (company: Anton Paar, instrument: Multivave 3000) at 800-1200 W within 60 min. The solubilized sample is transferred with 50 vol. % hydrochloric acid into a 100 ml flask and used for measurement.

Determination of the Density and Method for Determining the Theoretical Density

The density is determined according to the so-called buoyancy method. To this end a sample is weighed in air and in water and the volume is measured with a caliper rule (accuracy 0.2 mm). The relative density in % is the measured density/theoretical density×100. The theoretical densities are taken from tables of standard references.

Determination and Definition of "X-Ray Amorphous"

The samples were irradiated by a two circle goniometer Stadi P of the company Stoe in transmission mode with X-rays CuK alpha 1 between 2 theta 10-105°, step size 0.03°, and the diffraction diagrams were evaluated. The missing regularity of the lattice plane spacings leads to a diffuse scattering of the X-ray radiation and to broad distinct halos; no sharp diffraction lines or reflections can be detected. The material of the sample is X-ray amorphous.

Conversion into vol. % m—mass; V—volume
density, theo.=mass/volume
volume %=$mass_n$/$density_n$/($mass_1$/$density_1$+$mass_n$/$density_n$)

Preparation of the Sputter Target

Starting from powder mixtures according to the components listed in Table 1 (in vol. %) planar, round sputter targets were produced via hot pressing with a diameter of 75 mm. To this end powder components of purity 3N5 and of a mean particle size of less than 100 µm were mixed on a roller block. For the metal component (blackening component K2) powders with a particularly small mean particle size of less than 50 µm and less than 10 µm, respectively, were also selectively used. For the generation of the base component K1 and the additional component K3 stoichiometric oxides were used. On account of the metal content of component K2, sufficiently electrically conductive targets with a specific conductivity of <1 µΩ*cm were nevertheless obtained. As an alternative, it is possible to use, as far as available, and instead of the fully oxidic additional component K3, also niobium oxide, hafnium oxide, titanium oxide, vanadium oxide, yttrium oxide, zirconium oxide and/or aluminum oxide, also slightly substoichiometric oxides with an oxygen deficiency of a few percent up to 20%. This oxygen deficiency must then be taken into account in the calculation of the total metal content and the reduction degree, respectively.

The sputter targets obtained were analyzed for their homogeneity in that 5 samples of 1 g each were taken at any desired sites and were measured with respect to chemical composition and reduction degree. Depending on the mixture, the composition of the components varied by ±3% to ±5% relatively, and the reduction degree by +4 to +5% relatively.

It has been found that the target surface was the smoother and a stable sputter rate was adjusted the faster the finer the selected grains were. Especially the particle size of the metal component was here important. From this viewpoint a fine metal powder with a mean particle size<10 μm must be preferred. An excessively fine powder (<0.5 μm), however, makes handling more complicated again.

Preparation of Layers for Performing Etching Tests

Of these sputter targets, layers with a thickness of 125 nm were deposited by DC sputtering in a sputtering atmosphere of argon on glass substrates (Samples 1 to 9) and on a metal electrode (Samples 10 to 12), respectively.

The sputter parameters were here as follows:
Residual gas pressure: $2*10^{-6}$ mbar
Process pressure: $3*10^{-3}$ mbar at 200 sccm argon
Specific cathode powder: 5 W/cm$^2$ The layers obtained in this way were optically measured (Table 1). Moreover, the etch rate was determined on these layers in that the etch duration was determined, starting from which the full optical transparence of the layer is visually detectable.

TABLE 1

Refractive index, absorption and etch rate of partially absorbing layers

| | Composition (in vol. %) | | | | Optical properties | | Etch | |
|---|---|---|---|---|---|---|---|---|
| | | | | | n | K | rate | |
| No | ZnO | Nb$_2$O$_5$ | TiO$_2$ | Mo | (550 nm) | (550 nm) | (nm/s) | Rem. |
| 1 | 47 | 40 | 0 | 13 | 2.66 | 0.6 | 0.3 | S 1 |
| 2 | 54 | 30 | 0 | 16 | 2.71 | 0.67 | 2.1 | S 2 |
| 3 | 60 | 20 | 0 | 20 | 2.91 | 0.59 | 8.5 | |
| 4 | 70 | 5 | 0 | 25 | 2.77 | 0.48 | 9.4 | i) |
| 5 | 80 | 0 | 0 | 20 | 2.27 | 0.64 | 50 | ii) |
| 6 | 47 | 0 | 40 | 13 | 2.64 | 0.61 | 0.5 | |
| 7 | 60 | 0 | 20 | 20 | 2.92 | 0.52 | 10 | |
| 8 | 33 | 50 | 0 | 13 | 2.68 | 0.67 | 0.1 | iii) |
| 9 | 25 | 50 | 0 | 25 | 3.0 | 1.19 | 0.4 | iv) |
| 10 | 53 | 34 | 0 | 13 | 2.69 | 0.57 | 0.7 | |
| 11 | 84 | 0 | 0 | 16 | 2.64 | 0.59 | 30 | |
| 12 | 35 | 40 | 0 | 25 | 3.04 | 1.0 | 0.42 | v) |
| Layers etched with Al etchant: | | | | | | | | |
| 13 | 81 | 3 | 0 | 16 | 2.75 | 0.59 | 25 | |
| 14 | 77 | 7 | 0 | 16 | 2.66 | 0.65 | 4.5 | |
| 15 | 62 | 12 | 0 | 16 | 2.69 | 0.67 | 0.95 | |
| 16 | 77 | 0 | 7 | 16 | 2.69 | 0.68 | 5.9 | |
| 17 | 58 | 0 | 12 | 16 | 2.70 | 0.69 | 0.55 | | i) Deposition of the layer with 2.5% oxygen addition to the sputter gas Ar.
ii) Since no slowly etching additional component K3 was here added, the etch rate for the used etchant is much too high. With weaker etchants it is here however possible to work on condition that these weaker etchants are also sufficient for etching the underlying metal layer. This may for instance be the case with a metal layer of Al.
iii) Due to the high amount of the slowly etching additional component Nb$_2$O$_5$ a slow etch rate is obtained.
iv) Comparative example: Due to the high amount of the blackening component Mo an excessively high absorption coefficient is obtained. The refractive index is also unfavorably high. The corresponding layer properties are listed in Table 2. This also yields a considerably deteriorated visual reflection.
v) Comparative example: Due to the high amount of the blackening component Mo one obtains an excessively high absorption coefficient and an unfavorably high refractive index (and thus an excessively high visual reflection R$_v$).

The oxygen deficiency of the layers (the reduction degree) is substantially given by the content of Mo metal. During the sputtering process the reduction degree will change only insignificantly. This is however not true for Sample 4 where the sputtering atmosphere has been mixed with small amounts of oxygen during deposition of the partially absorbing layer. As a consequence, a part of the Mo metal contained in the target or of corresponding substoichiometric oxides is additionally oxidized. This reduces the metal content (oxygen deficiency) in the layer in comparison with sputtering in pure Ar atmosphere and thus reduces the absorption kappa.

The oxygen deficiency of all layers, with the exception of the layers of Samples 9 and 12, is in the range of 30-65% of the stoichiometric oxygen content. This oxygen deficiency leads—if the substoichiometrically existing oxygen content on the whole is arithmetically ascribed to a fully oxidic phase—to a metallic phase with an amount in the range of 10-20 vol. %. As for Samples 9 and 12, the reduction degree is higher than 55% of the stoichiometric oxygen content.

For etching a commercial copper etchant was used on the basis of H$_2$O$_2$. However, the above layers are also etchable at room temperature with an etchant consisting of H$_2$O=785 ml+H$_2$O$_2$=215 ml+30 g K$_2$S$_2$O$_5$+15 g H$_5$F$_2$N, wherein other values then tend to follow for the etch rate. The slightly different etch rates obtained, depending on the respective etchants, can easily be compensated by varying the ratio of base component K1 (for example ZnO) to additional component K3 (for instance Nb$_2$O$_5$ or TiO$_2$). To a certain extent the content of metallic blackening component K2 (for instance Mo or W) can also be varied for this purpose. It must however be taken into account that this will also have an impact on absorption.

The following composition was used as a further etchant for etching Al: CH$_3$COOH 10%+H$_3$PO$_4$ 71%+HNO$_3$ 1.8%+deionized H$_2$O (temperature: 41° C.).

Depending on the amount of the layer components, etch rates in the range of 0.2 nm/s to 10 nm/s are obtained for the partially absorbing layer according to the invention. These are values of good practical usability.

Preparation of Layer Systems with Partially Absorbing Layers

Examples 1 to 4 are listed hereinafter for layer systems according to the invention. These layer systems are distinguished by a partially absorbing layer which at a wavelength of around 550 nm has an absorption coefficient kappa<0.7, preferably in the range of 0.4-0.69. Moreover, these layers have an effective visual reflection R$_{v,eff}$<5%, preferably <2%. The reflection measurement was carried out through the glass substrate (reference numeral 3 in FIG. 1). Therefore, for the determination of the effective reflection R$_{v,eff}$ of the double layer system, the reflection of 4% on the glass surface has to be deducted from the total reflection. Also other transparent media such as e.g. transparent sheets represent advantageous intermediate layers between the partially absorbing layer and air.

These media normally have a refractive index of 1.4 to 2.0 (at a measurement wavelength of 550 nm).

The layers were produced as follows:

A partially absorbing layer A was deposited on the glass substrate 3 by way of pure DC argon sputtering and the above-indicated parameters. The sputter targets were here used, as listed in Table 2 (Samples A to K) and Table 3 (Sample O).

Subsequently, and without interruption of the vacuum, the metal layer B was then deposited. The thickness of the partially absorbing layer A was each time optimized in a few tests with the aim to obtain an effective reflection as low as possible and also to maintain a neutral color at the same time. Corresponding layer thicknesses were in the range of 30-55 nm. It has been found that the partially absorbing layers produced in this way are distinguished by a neutral color. In the reflected light proportion the following is applicable to the coordinates a*, b* in the CIE L*a*b system:

−2<a*<6; −9<b*<5.

In the following Examples 1 to 4 the partially absorbing layers S1 and S2 according to Table 1 were integrated into different layer systems and their reflection behaviors and color values were determined (the sample designations refer to Table 2; the figures respectively preceding the components are concentration data in vol. %).

The diagrams for explaining the samples according to FIGS. 3 to 10 respectively show the curve of the visual reflection R in [%] over the wavelength range in [nm] of about 380 nm to 780 nm. In curves 5-10, the measurements were taken against air and thus $R_v=R_{v,eff}$. In the tables the layers were measured on glass, and 4% (reflection on the glass surface) were therefore deducted.

Example 1 (Sample A)

Partially absorbing layer S1: 40 $Nb_2O_5$ 47 ZnO, 13 Mo
Layer system: glass/S1 (thickness: 42.5 nm)/Mo (thickness: 40 nm)

FIG. 3 shows for this layer system the curve of the reflection R in [%] over the wavelength range λ in [nm] of about 380 nm to 780 nm. The reflection shows a minimum (including reflection on the glass substrate) at a wavelength of around 550 nm with a reflection value of about 5.2%. This yields an effective visual reflection $R_{v,eff}$ of 1.2% after deduction of the reflection on the surface of the glass substrate. This yielded a*=2.5; b*=−3.1 for the color values.

Example 2 (Sample B)

Partially absorbing layer S2: 30 $Nb_2O_5$, 54 ZnO, 16 Mo
Layer system: glass/S2 (45 nm)/Mo (40 nm)

FIG. 4 shows a minimum (including reflection on the glass substrate) for this layer system at a wavelength of around 550 nm with a reflection value of about 6.6%. This yields an effective visual reflection $R_{v,eff}$ of 2.6% after deduction of the reflection on the surface of the glass substrate.

This yielded for the color values: a*=3.0; b*=−4.1

Example 3 (Sample D)

Partially absorbing layer S1: 40 $Nb_2O_5$, 47 ZnO, 13 Mo
Layer system: glass/S1 (40 nm)/Cu (100 nm)

FIG. 5 shows for this layer system that the reflection in the wavelength range of about 529 to 600 nm has a wide minimum with a reflection value of about Rv=7.7% (including reflection from the glass substrate). This yields an effective visual reflection $R_{v,eff}$ of about 3.7% after deduction of the reflection on the surface of the glass substrate.

This yielded for the color values: a*=0.1; b*=−7.3

Example 4 (Sample E)

Partially absorbing layer S2: 30 $Nb_2O_5$, 54 ZnO, 16 Mo
Layer system: glass/S2 (35 nm)/Cu (100 nm)

The curve of the reflection R according to FIG. 6 shows for this layer system a minimum at a wavelength of about 590 nm with a reflection value of about Rv=5.2%, including reflection from the glass substrate. This yields an effective visual reflection $R_{v,eff}$ of about 1.2% after deduction of the reflection on the surface of the glass substrate.

This yielded for the color values: a*=4.1; b*=−8.1

The above Examples 1 to 4 describe layer systems in which the partially absorbing layer is in contact with a transparent substrate. In the layer systems according to the invention, the partially absorbing layer, however, may also be in contact with a fluid medium having a refractive index n<2, as for instance air, nitrogen, or a liquid. This, however, will then yield, depending on the refractive index of the medium which is in direct contact with the partially absorbing layer, reflection values that are about 5-10% higher than in the measurement against a glass substrate. The lower the refractive index of the fluid medium, the higher is the resulting reflection. It may here be of advantage to deposit also a low-refractive dielectric layer at the side of the partially absorbing layer that is facing the viewer, for instance a standard anti-reflective layer. As shown by the following Examples 5 to 7, good blackening values of metal layers are however also achievable when the reflection is viewed against air (instead of a glass substrate).

The metal layer which must be blackened is positioned behind the partially absorbing layer, as viewed by the viewer, so that the reflection measurement is directly performed on the partially absorbing layer.

This layer systems are distinguished by a partially absorbing layer which at a wavelength of about 550 nm has an absorption coefficient kappa<0.7, preferably in the range of 0.4-0.69. Moreover, these layers have an effective visual reflection $R_{v,eff}$<7%, preferably <3%.

The layers of Examples 5 to 7 were produced as follows:
With the help of a standard sputtering process a metal layer B was first deposited on a glass substrate. Thereupon, without interruption of the vacuum, a partially absorbing layer (hereinafter respectively called "S3") was deposited with the help of pure DC argon sputtering and the parameters indicated in Table 1. The sputter targets were here used, as listed in Table 2 (Samples L to N).

Example 5 (Sample N)

Partially absorbing layer S3 34 $Nb_2O_5$, 53 ZnO, 13 Mo
Layer system: glass/Mo (30 nm)/S3 (43 nm)

FIG. 7 shows for this layer system a curve of the reflection with a minimum of about 1.8% (including reflection on the surface of the partially absorbing layer S3). This yields an effective visual reflection $R_{v,eff}$ of 1.8%.

Example 6 (Sample M)

Partially absorbing layer S3 84 ZnO, 16 Mo
Layer system: glass/Al (130 nm)/S3 (40 nm)

FIG. 8 shows for this layer system the curve of reflection R in [%]. At a wavelength of about 550 m with a reflection value of about R=0.4% it shows a minimum (including reflection on the surface of the partially absorbing layer S3). This yields an effective visual reflection $R_{v,eff}$ of 2.1%.

Example 7 (Sample L)

Partially absorbing layer S3 84 ZnO, 16 Mo
Layer system: glass/Cu (250 nm)/S3 (40 nm)
Layer thickness 40 nm; Rv=3.7%

The curve of the reflection R in [%] for this layer system according to FIG. 9 shows a minimum (including reflection on the surface of the partially absorbing layer S3) at a reflection value of about R=2% at a wavelength of 550 nm. This yields an effective visual reflection $R_{v,eff}$ of 3.7.

Comparative Example (Table 3: Sample P)

Partially absorbing layer S3 40 $Nb_2O_5$, 35 ZnO, 25 Mo
Layer system: glass/Mo (30 nm)/S3 (50 nm)
Rv=23%

The curve of the reflection R (in %) for this layer system is shown in FIG. 10. Thus the reflection at a wavelength of about 630 nm shows a minimum with a reflection value of about R=22.7%. This high reflectivity of the partially absorbing layer S3 against air is based on its high absorption kappa.

The following Table 2 gives further examples of target compositions according to the invention and of partially absorbing layers produced therefrom.

The following Table 2 lists optical characteristics (effective visual reflection $R_{v,eff}$ and CIE L*a*b color a*, b* (as far as measured) for partially absorbing layers "S1" of different compositions in combination with different metal layers of thickness d. The two last columns indicate the coordinates a* and b* according to the CIE L*a*b system.

TABLE 2

Composition, thickness and optical characteristics of layer systems

| No | Target composition (vol. %) | | | Thickness S (nm) | Metal layer/ d (nm) | $R_{v,eff}$ (%) | a* | b* |
|---|---|---|---|---|---|---|---|---|
| A | ZnO 47 | $Nb_2O_5$ 40 | Mo 13 | 42.5 | Mo/40 | 1.2 | 2.5 | −3.1 |
| B | ZnO 54 | $Nb_2O_5$ 30 | Mo 16 | 45 | Mo/40 | 2.6 | 3.0 | −4.1 |
| C | ZnO 51 | $Nb_2O_5$ 35 | Mo 14 | 43 | Mo/50 | 0.8 | 2.7 | −3.5 |
| D | ZnO 47 | $Nb_2O_5$ 40 | Mo 13 | 40 | Cu/100 | 3.7 | 0.1 | −7.3 |
| E | ZnO 54 | $Nb_2O_5$ 30 | Mo 16 | 35 | Cu/100 | 1.2 | 4.8 | −8.1 |
| F | ZnO 80 | $Nb_2O_5$ 0 | Mo 20 | 40 | W/100 | 1.0 | 2.9 | −3.3 |
| G | ZnO 61 | $Nb_2O_5$ 25 | W 14 | 42.5 | Mo/50 | 0.9 | 3.0 | −3.6 |
| H | ZnO 47 | $TiO_2$ 40 | Mo 13 | 40 | Mo/40 | 1.1 | 4.2 | −3.0 |
| I | ZnO 60 | $TiO_2$ 20 | Mo 20 | 35 | Cu/80 | 3.2 | 0.5 | −6.8 |
| J | ZnO 61 | $TiO_2$ 20 | W 19 | 40 | Mo/40 | 1.2 | 3.4 | −3.8 |
| K | $SnO_2$ 50 | $Nb_2O_5$ 35 | Mo 15 | 44 | Cu/50 | 1.4 | 0.5 | −6.9 |
| L | ZnO 84 | $Nb_2O_5$ 0 | Mo 16 | 40 | Cu/250 | 3.7 | not spec. | not spec. |
| M | ZnO 84 | $Nb_2O_5$ 0 | Mo 16 | 40 | Al/130 | 2.1 | not spec. | not spec. |
| N | ZnO 53 | $Nb_2O_5$ 34 | Mo 13 | 43 | Mo/30 | 1.8 | 5.7 | −5.1 | not spec. = not specified

Table 3 gives comparative examples that illustrate the negative impact of an excessively high absorption coefficient on the visual reflection of the layer system.

TABLE 3

Comparative Examples

| No | Target composition (vol. %) | | | Thickness S (nm) | Metal layer/ d (nm) | $R_{v,eff}$ (%) | a* | b* |
|---|---|---|---|---|---|---|---|---|
| O | ZnO 25 | $Nb_2O_5$ 50 | Mo 25 | 40 | Mo/50 | 8.2 | 0.2 | 2.6 |
| P | ZnO 35 | $Nb_2O_5$ 40 | Mo 25 | 40 | Mo/40 | 23 | 1.36 | −1.67 |

Sample O is a comparative example of a layer system as in Samples A to K, where the reflection for a partially absorbing layer in contact with a glass substrate is determined. The composition of the partially absorbing layer corresponds to Sample No. 9 of Table 1.

The layer system of Sample P is a comparative example of a layer system as in Samples L to N with a partially absorbing layer in contact with air. The composition of the partially absorbing layer corresponds to Sample No. 12 of Table 1.

The invention claimed is:

1. A sputter target for producing an optically partially absorbing layer of a double-layer system, the sputter target comprising a target material which contains a first metal Me1 and a second metal Me2 and a third metal Me3,
   wherein the first metal Me1 is selected from a group 1 consisting of tin, zinc, indium and mixtures thereof;
   wherein the first metal Me1 is present in the form of an oxide, oxynitride, substoichiometric oxide or substoichiometric oxynitride;
   wherein the second metal Me2 is selected from a group 2 consisting of Mo, W and alloys thereof that contain at least 50 wt. % of Mo or W; and
   wherein the third metal Me3 is selected from a group 3 consisting of niobium, hafnium, titanium, tantalum, vanadium, yttrium, zirconium, aluminum and mixtures thereof, which is present as an oxide, substoichiometric oxide, or substoichiometric oxynitride; and
   wherein the content of oxides, substoichiometric oxides or substoichiometric oxynitrides of group 3 is in the range of 2 to 45 vol. %.

2. The sputter target of claim 1, wherein the content of oxides, substoichiometric oxides or substoichiometric oxynitrides of group 3 is in the range of 10 to 45 vol. %.

3. The sputter target of claim 1, wherein the metals of group 2 are contained in an amount between 10 and 20 vol. %.

4. A The sputter target of claim 1, wherein the target material has a density of more than 95% of the theoretical density and a content of impurities of less than 500 wt. ppm, and wherein a reduction degree which is obtained in the oxidic target material arithmetically as a proportion of the second metal Met in metallic phase in the range of 10-20 vol. % if the substoichiometrically existing oxygen on the whole is ascribed to a fully oxidic phase.

5. The sputter target of claim 1, wherein the second metal Me2 is present as a powder with a d50 value of less than 50 µm.

6. The sputter target of claim 1, wherein the content of oxides, substoichiometric oxides or oxynitrides of group 3 is in the range of 25 to 40 vol. %.

7. The sputter target of claim 1, wherein the second metal Me2 is present as a powder with a d50 value of less than 10 µm.

8. A sputter target for producing an optically partially absorbing layer of a double-layer system, the sputter target comprising a target material which contains a first substance and a second substance,
- wherein the first substance is an oxide, oxynitride, substoichiometric oxide or substoichiometric oxynitride containing a first metal Me1 selected from a group 1 consisting of tin, zinc, indium and mixtures thereof;
- wherein the second substance is a second metal Me2 selected from a group 2 consisting of Mo, W and alloys thereof that contain at least 50 wt. % of Mo or W; and
- wherein the target material comprises a homogeneous composition of the first substance and the second substance forming the same, such that the composition of five samples of 1 g each has a standard deviation of each substance of less than 5%, based on the maximum content of the substance, and a homogeneous reduction degree, such that the reduction degree of five samples of 1 g each has a standard deviation in the reduction degree of less than 5%.

9. A sputter target for producing an optically partially absorbing layer of a double-layer system, the sputter target comprising a target material which contains a first metal Me1, a second metal Me2, and a third metal Me3;
- wherein the first metal Me1 is selected from a group 1 consisting of tin, zinc, indium and mixtures thereof;
- wherein the first metal Me1 is present in the form of an oxide, oxynitride, substoichiometric oxide or substoichiometric oxynitride;
- wherein the second metal Me2 is selected from a group 2 consisting of Mo, W and alloys thereof; and
- wherein the third metal Me3 is selected from a group 3 consisting of niobium, tantalum, vanadium, yttrium, and mixtures thereof, which is present as an oxide, substoichiometric oxide or substoichiometric oxynitride.

10. The sputter target of claim 9, wherein the content of oxides, substoichiometric oxides or substoichiometric oxynitrides of group 3 is in the range of 2 to 45 vol. %.

11. The sputter target of claim 9, wherein the content of oxides, substoichiometric oxides or substoichiometric oxynitrides of group 3 is in the range of 5 to 40 vol. %.

* * * * *